United States Patent
Bleeker

(10) Patent No.: US 7,826,035 B2
(45) Date of Patent: Nov. 2, 2010

(54) LITHOGRAPHIC APPARATUS AND DEVICE MANUFACTURING METHOD

(75) Inventor: Arno Jan Bleeker, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 291 days.

(21) Appl. No.: 11/725,499

(22) Filed: Mar. 20, 2007

(65) Prior Publication Data

US 2007/0165203 A1     Jul. 19, 2007

Related U.S. Application Data

(63) Continuation of application No. 10/972,788, filed on Oct. 26, 2004, now Pat. No. 7,196,772.

(30) Foreign Application Priority Data

Nov. 7, 2003     (EP) ................................ 03257056

(51) Int. Cl.
    *G03B 27/54* (2006.01)
(52) U.S. Cl. ................ 355/67; 355/53; 355/77
(58) Field of Classification Search ............ 355/53, 355/67, 77
    See application file for complete search history.

(56) References Cited

U.S. PATENT DOCUMENTS

| | | | |
|---|---|---|---|
| 3,946,370 A * | 3/1976 | Schmidt et al. ............ 365/125 |
| 4,786,128 A | 11/1988 | Birnbach | |
| 4,790,635 A | 12/1988 | Apsley | |
| 4,796,982 A | 1/1989 | Kitabatake et al. | |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,608,575 A * | 3/1997 | Suzuki ....................... 359/558 |
| 5,677,703 A | 10/1997 | Bhuva et al. | |
| 5,808,797 A | 9/1998 | Bloom et al. | |
| 5,982,553 A | 11/1999 | Bloom et al. | |
| 5,989,752 A | 11/1999 | Chiu | |
| 6,084,656 A | 7/2000 | Choi et al. | |

(Continued)

FOREIGN PATENT DOCUMENTS

EP     0154 504 A2     9/1985

(Continued)

OTHER PUBLICATIONS

European Search Report from European Patent Application No. 04256798.2 filed Feb. 14, 2005, 4 pgs.
European Search 03257056.6 filed Jul. 9, 2004, 10 pages.

*Primary Examiner*—Hung Henry Nguyen
*Assistant Examiner*—Mesfin T Asfaw
(74) *Attorney, Agent, or Firm*—Sterne, Kessler, Goldstein & Fox P.L.L.C.

(57) ABSTRACT

An array of individually controllable elements includes elements, each formed of a stack of layers of dielectric material. At least one layer is an electro-optical material. The at least one layer's refractive index for radiation that is plane polarized in a given direction can be changed by application of a voltage in order to change the reflection/transmission characteristic of the boundary between this layer and the adjacent layer.

19 Claims, 3 Drawing Sheets

U.S. PATENT DOCUMENTS

| | | |
|---|---|---|
| 6,133,986 A | 10/2000 | Johnson |
| 6,177,980 B1 | 1/2001 | Johnson |
| 6,211,993 B1 | 4/2001 | Wang et al. |
| 6,291,110 B1 | 9/2001 | Cooper et al. |
| 6,687,041 B1 | 2/2004 | Sandstrom |
| 6,747,783 B1 | 6/2004 | Sandstrom |
| 6,770,068 B2 | 8/2004 | Ruiz et al. |
| 6,795,169 B2 | 9/2004 | Tanaka et al. |
| 6,798,550 B1 | 9/2004 | Wang et al. |
| 6,806,897 B2 | 10/2004 | Kataoka et al. |
| 6,811,953 B2 | 11/2004 | Hatada et al. |
| 6,870,554 B2 | 3/2005 | Jain |
| 6,870,601 B2 | 3/2005 | Liebregts et al. |
| 7,196,772 B2 | 3/2007 | Bleeker |
| 2004/0239908 A1 * | 12/2004 | Bleeker et al. ............ 355/67 |
| 2005/0007572 A1 | 1/2005 | George et al. |

FOREIGN PATENT DOCUMENTS

| | | |
|---|---|---|
| EP | 1 530 092 A1 | 5/2005 |
| WO | WO 98/33096 A1 | 7/1998 |
| WO | WO 98/38597 A2 | 9/1998 |
| WO | WO 98/38597 A3 | 9/1998 |

* cited by examiner

LITHOGRAPHIC APPARATUS AND DEVICE MANUFACTURING METHOD

CROSS REFERENCE TO RELATED APPLICATIONS

This application is a continuation of U.S. application Ser. No. 10/972,788, filed Oct. 26, 2004 (now U.S. Pat. No. 7,196,772 that issued Mar. 27, 2007), which claims the benefit under 35 U.S.C. 119 to EP Appl. No. 03257056.6, filed Nov. 7, 2003, which are both incorporated by reference herein in their entireties.

BACKGROUND

1. Field of the Invention

The present invention relates to a lithographic apparatus and a device manufacturing method.

2. Related Art

A lithographic apparatus is a machine that applies a desired pattern onto a target portion of a substrate. Lithographic apparatus can be used, for example, in the manufacture of integrated circuits (ICs), flat panel displays and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (resist). Instead of a mask, the patterning means may comprise an array of individually controllable elements that generate the circuit pattern on an impinging light beam.

In general, a single substrate will contain a network of adjacent target portions that are successively exposed. Lithographic apparatus include steppers, in which each target portion is irradiated by exposing an entire pattern onto the target portion in one pass, and scanners, in which each target portion is irradiated by scanning the pattern through the beam in a given direction (the "scanning" direction), while synchronously scanning the substrate parallel or anti-parallel to this direction.

Conventional devices used as arrays of individually controllable elements are difficult to manufacture and, consequently, the yields for their manufacturing processes are low. This results in increased costs. Furthermore, reducing the pixel size on such arrays of individually controllable elements further increases the difficulty in manufacturing the devices and therefore further reduces the manufacturing yields.

Therefore, what is needed is an alternative array of individually controllable elements for use in lithographic projection apparatus.

SUMMARY

According to an aspect of the invention, there is provided a lithographic apparatus comprising an illumination system, an array of individually controllable elements, a substrate table, and a projection system. The illumination system conditions a beam of radiation. The array of individually controllable elements serves to impart the beam with a pattern in its cross-section. The substrate table supports a substrate. The projection system projects the patterned beam onto a target portion of the substrate. Each of the individually controllable elements comprises a stack of three layers. At least the middle one of the layers is formed of a solid state electro-optical material. On application of a control signal, the element may be selectively changed between a first state, in which there is a greater difference in refractive index for one polarization state between the middle one of the three layers and the other two layers, and a second state, in which there is a smaller difference in the refractive index for the one polarization state, such that the proportions of the radiation that is transmitted and reflected, respectively, at the boundary of the electro-optical material layer with at least one adjacent layer is different in the two states.

In one example, the three layers comprise dielectric layers.

In one example, each element of the array of individually controllable elements can, by the application of a control signal, change the proportion of the radiation that is reflected and the proportion that is transmitted through the stack.

Such an array of individually controllable elements can be used as either a transmissive or reflective array of individually controllable elements. Furthermore, the device is simpler to manufacture than conventional arrays of individually controllable elements because each individually controllable element is formed from several layers of material that can be sequentially deposited on a substrate. Consequently, the manufacturing yield of such arrays of individually controllable elements will be better than that of conventional devices, even if the size of each of the individually controllable elements in the array is smaller. In addition, because there are no moving parts, such an array of individually controllable elements will be more durable.

In one example, additional layers may be added to the stack. This can be used to improve the reflectivity of each individually controllable element, especially if the thickness of each layer is one-quarter of the wavelength of the radiation used.

In one example, alternate layers of the stack are formed from the material with a fixed refractive index, and the remainder are formed from an electro-optical material.

In one example, the layers of electro-optical material may be arranged such that their respective extraordinary axes are substantially mutually parallel. Therefore, when these layers are set to have a refractive index that is relatively close to that of the fixed refractive index layers, the individually controllable element is relatively transmissive but, when the refractive index of the electro-optical layers is set to a different level than that of the fixed refractive index layers, the individually controllable element is more reflective than if a stack with a single layer of electro-optical material is used.

In one example, the layers of electro-optical material may be arranged such that alternate layers are arranged such that their respective extraordinary axes are mutually perpendicular. This allows the transmissive/reflective characteristic of each individually controllable element to be independently controlled for radiation which is plane polarized in two orthogonal directions. consequently, it is possible to provide simultaneous patterning of a beam of radiation for dual dipole illumination, for example, effectively separately illuminating orthogonally oriented features of the pattern to be set on the array of individually controllable elements.

In one example, layers of electro-optical material within a stack that have mutually parallel respective extraordinary axes can be set together, as described above, for example for enhanced reflection, or, alternatively, different voltages can be applied to each. In one example, this may allow independent control of the reflective/transmissive characteristic of the individually controllable element and the phase shift of the radiation introduced by the array of individually controllable elements. Consequently, adjacent elements on the array of individually controllable elements can be set to, for example, reflect the same intensity of radiation as one another but with a relative phase difference. Thus, it is possible to form a phase-shifting array of individually controllable elements.

In one example, with a sufficient number of controllable electro-optical layers, it is possible to provide an array of individually controllable elements that can control the phase and gray-scale of two patterns for dual dipole illumination.

In one example, each of the layers of the electro-optical material within the stack may have control signals applied to it by individually addressable electrodes. Alternatively, in order to simplify the control of the array of individually controllable elements, a group of layers of electro-optical material may share common electrodes if, for example, the same control signal is always to be applied to these layers.

According to a further aspect of the invention, there is provided an array of individually controllable elements, configured to impart a beam of radiation with a pattern in its cross-section. Each of the individually controllable elements comprises a stack of three dielectric layers. At least the middle one of the layers is formed of a solid state electro-optical material. On application of a control signal, the element may be selectively changed between a first state, in which there is a greater difference in refractive index for one polarization state between the middle one of the three dielectric layers and the other two layers, and a second state, in which there is a smaller difference in the refractive index for the one polarization state such that the proportions of the radiation that is transmitted and reflected, respectively, at the boundary of the electro-optical material layer with at least one adjacent layer is different in the two states.

According to a further aspect of the invention, there is provided a device manufacturing method comprising the following steps. Providing a substrate. Conditioning a beam of radiation using an illumination system. Using an array of individually controllable elements to impart the beam with a pattern in its cross-section. Projecting the patterned beam of radiation onto a target portion of the substrate. Each of the individually controllable elements comprises a stack of three dielectric layers. At least the middle one of the layers is formed of a solid state electro-optical material. On application of a control signal, the element may be selectively changed between a first state in which there is a greater difference in refractive index for one polarization state between the middle one of the three dielectric layers and the other two layers, and a second state in which there is a smaller difference in the refractive index for the one polarization state such that the proportions of the radiation that is transmitted and reflected, respectively, at the boundary of the electro-optical material layer with at least one adjacent layer is different in the two states.

BRIEF DESCRIPTION OF THE DRAWINGS

Embodiments of the invention will now be described, by way of example only, with reference to the accompanying schematic drawings in which corresponding reference symbols indicate corresponding parts.

DETAILED DESCRIPTION OF THE EMBODIMENTS

Terminology

Figure 1:
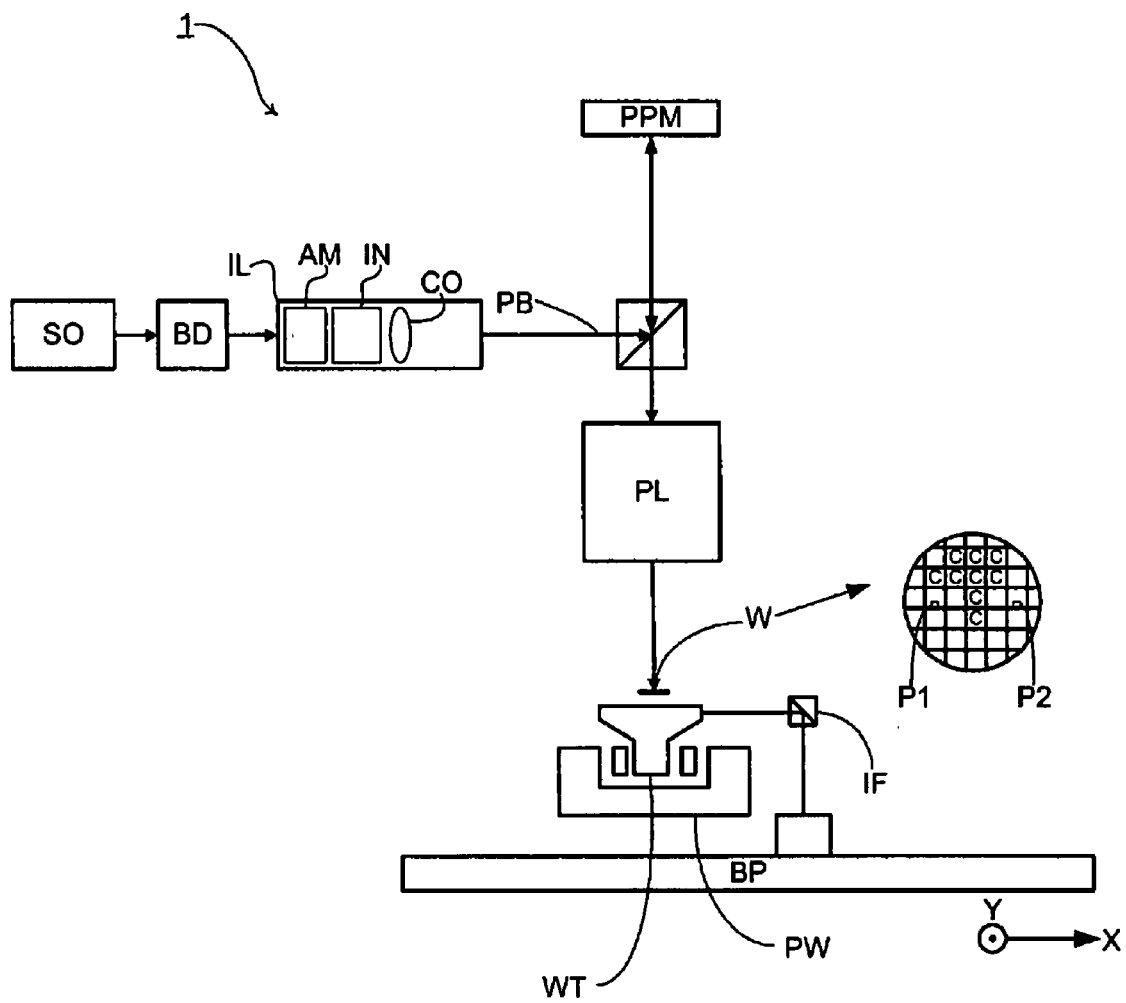
FIG. 1 depicts a lithographic apparatus according to one embodiment of the invention.

The term "array of individually controllable elements" as here employed should be broadly interpreted as referring to any means that can be used to endow an incoming radiation beam with a patterned cross-section, so that a desired pattern can be created in a target portion of the substrate; the terms "light valve" and "Spatial Light Modulator" (SLM) can also be used in this context. Examples of such patterning means include, but are not limited to, a programmable mirror array and a programmable liquid crystal device (LCD) array.

A programmable mirror array may comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate.

An array of diffractive optical micro-electrical-mechanical (MEMS) devices can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors.

The matrix addressing can be performed using suitable electronic means. In the examples described above, the array of individually controllable elements can comprise one or more programmable mirror arrays. More information on mirror arrays can be found, for example, from U.S. Pat. Nos. 5,296,891 and 5,523,193, and PCT patent applications WO 98/38597 and WO 98/33096, which are incorporated herein by reference.

An example programmable LCD array is shown in U.S. Pat. No. 5,229,872, which is incorporated herein by reference.

It should be appreciated that where pre-biasing of features, optical proximity correction features, phase variation techniques, and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures, during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including, but not necessarily limited to, ultraviolet (UV) radiation (e.g. having a wavelength of 408, 355, 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables. In Such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the array of individually controllable elements and the first element of the projection system. Immersion techniques are well known in the art for increasing the numerical aperture of projection systems.

Exemplary Environment

FIG. 1 schematically depicts a lithographic projection apparatus, according to one embodiment of the invention. The apparatus comprises an illumination system (illuminator) IL, an array of individually controllable elements PPM, a substrate table WT for supporting a substrate W, and a projection system ("lens") PL.

Illumination system (illuminator) IL provides a beam PB of radiation e.g., UV radiation).

The array of individually controllable elements PPM (e.g., a programmable mirror array) patterns the beam. In one example, the position of the array of individually controllable elements will be fixed relative to projection system PL. In another example, it may instead be connected to a positioning means for accurately positioning it with respect to projection system PL.

As discussed above, the substrate table WT (e.g., a wafer table) supports the substrate W (e.g., a resist-coated wafer). The substrate table WT is also connected to a positioning means PW for accurately positioning the substrate with respect to projection system PL.

The projection system ("lens") PL images a pattern imparted to the beam PB by the array of individually controllable elements PPM onto a target portion C (e.g., comprising one or more dies) of the substrate W. In one example, the projection system PL may image the array of individually controllable elements PPM onto the substrate W. In anther example, the projection system PL may image secondary sources, for which the elements of the array of individually controllable elements PPM act as shutters. The projection system PL may also comprise an array of focusing elements, such as a micro lens array (known as an MLA) or a Fresnel lens array. This can be done, for example, to form the secondary sources and to image microspots onto the substrate.

In the embodiment shown, the apparatus is of a reflective type (i.e., has a reflective array of individually controllable elements). However, in general, it may also be of a transmissive type, e.g., with a transmissive array of individually controllable elements.

The illuminator IL receives a beam of radiation from a radiation source SO. In one example, the source SO and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD. In this case the beam delivery system BD includes, but is not limited to, suitable directing mirrors and/or a beam expander. In other examples the source SO may be integral part of the apparatus, for example when the source is a mercury lamp. In this example, the source SO and the illuminator IL, together with the beam delivery system BD, if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator IL can be adjusted. In some examples the illuminator IL comprises various other components, such as an integrator IN and a condenser CO. The illuminator IL provides a conditioned beam of radiation, referred to as the beam PB, having a desired uniformity and intensity distribution in its cross-section.

The beam PB subsequently interacts with the array of individually controllable elements PPM. Having been reflected by the array of individually controllable elements PPM, the beam PB passes through the projection system PL, which focuses the beam PB onto a target portion C of the substrate W.

In one example, with the aid of a positioning means PW, and possibly an interferonietric measuring means IF, the substrate table WT can be moved accurately, e.g., so as to position different target portions C in the path of the beam PB.

In one example, a positioning means PW for the array of individually controllable elements PPM can be used to accurately correct the position of the array of individually controllable elements PPM with respect to the path of the beam PB, e.g., during a scan.

In one example, movement of the substrate table WT is realized with the aid of a long-stroke module (course positioning) and a short-stroke module (fine positioning), which are not explicitly depicted in FIG. 1. A similar system may also be used to position the array of individually controllable elements PPM.

It will be appreciated that the beam PB may alternatively/additionally be moveable while the substrate table WT and/or the array of individually controllable elements PPM may have a fixed position to provide the required relative movement.

As a further alternative, that may be especially applicable in the manufacture of flat panel displays, the position of the substrate table WT and the projection system PL may be fixed and the substrate W may be arranged to be moved relative to the substrate table WT. For example, the substrate table WT may be provided with a system for scanning the substrate W across it at a substantially constant velocity.

Although the lithography The apparatus of the invention is herein described as being for exposing a resist on a substrate, it will be appreciated that the invention is not limited to this use and the apparatus may be used to project a patterned beam for use in resistless lithography.

The depicted apparatus can be used in four one modes: a step mode, a scan mode, a pulse mode, and a continuous scan mode.

In a Step mode, the array of individually controllable elements PPM imparts an entire pattern to the beam PB, which is projected onto a target portion C in one pass (i.e., a single static exposure). The substrate table WT is then shifted in the X and/or Y direction, so that a different target portion C can be exposed. In step mode, the maximum size of the exposure field limits the size of the target portion C imaged in a single static exposure.

In Scan mode, the array of individually controllable elements PPM is movable in a given direction (e.g., a "scan direction" or a Y direction) with a speed v, so that the beam PB is caused to scan over the array of individually controllable elements PPM. Concurrently, the substrate table WT is substantially simultaneously moved in the same or opposite direction at a speed V=Mv, in which M is the magnification of the lens PL. In scan mode, the maximum size of the exposure field limits the width (in the non-scanning direction) of the target portion C in a single dynamic exposure, whereas the length of the scanning motion determines the height (in the scanning direction) of the target portion C.

In Pulse mode, the array of individually controllable elements PPM is kept essentially stationary and the entire pattern is projected onto a target portion C of the substrate W using a pulsed radiation system. The substrate table WT is moved with an essentially constant speed, such that the beam PB is caused to scan a line across the substrate W. The pattern on the array of individually controllable elements PPM is updated as required between pulses of the radiation system. The pulses are timed such that successive target portions C are exposed at the required locations on the substrate W. Consequently, the beam PB scans across the substrate W to expose the complete pattern for a strip of the substrate W. The process is repeated until the complete substrate W has been exposed line by line.

Continuous scan mode is essentially the same as pulse mode except that a substantially constant radiation source is used and the pattern on the array of individually controllable elements PM is updated as the beam PB scans across the substrate W and exposes it.

Combinations and/or variations on the above described modes of use or entirely different modes of use may also be employed.

Exemplary Elements in Arrays of Individually Controllable Elements

Figure 2:
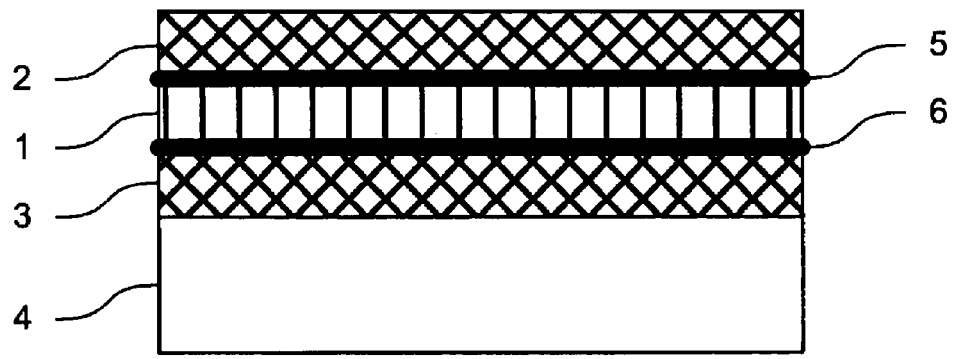
FIGS. 2, 3, and 4 depict elements that can be used to form a programmable patterning device, according to various embodiments of the present invention.

FIG. 2 depicts an element that can be used to form a programmable patterning device (e.g., PPM), according to one embodiment of the present invention. In this embodiment, each element of the array of individually controllable elements PPM, also known as a pixel, is made up of a stack of layers of dielectric material. It is comprised of a layer 1 of electro-optical material, sandwiched between two layers 2,3 of dielectric material with a fixed refractive index. In one example, layers 2,3 have the same refractive index. The electro-optical material has the property that its refractive index for radiation that is plane polarized in a given direction can be changed by applying a voltage across the electro-optical material. If the refractive index of electro-optical material layer 1 is the same as the refractive index of layers 2,3, then the element will be largely transparent. If, however, the refractive index of electro-optical material 1 is different from that of layers 2,3 then radiation will be reflected at the boundaries between the layers.

In one example, by selecting the thickness of the layers 1, 2, and 3 to be one-quarter of the wavelength of the radiation that will be incident on the elements of the array of individually controllable elements PPM, the radiation reflected from the boundary between electro-optical material layer 1 and a first of the fixed refractive index layers 2 will constructively interfere with the radiation reflected from the boundary between electro-optical material layer 1 and a second layer 3 of fixed refractive index material.

Therefore, by applying a voltage to electro-optical material layer 1, the element of the array of individually controllable elements PPM can be switched between a state in which all three layers 1, 2, and 3 have similar refractive indices and the element is largely transmissive and a state in which the middle layer of the stack, namely electro-optical material layer 1, has a different refractive index (i.e., for radiation that is plane polarized in a given direction) than the adjacent layers 2 and 3, and the element is significantly reflective for the radiation that is plane polarized in that direction.

In one example, by setting different elements to be reflective or transmissive, a plurality of such elements can be used to pattern a beam of radiation (e.g., PB). Clearly, such an array of individually controllable elements PPM can either be used in a reflective mode or a transmissive mode with radiation that is designed to be part of the patterned beam of radiation either being reflected from or transmitted through the elements, respectively.

In one example, the stack will always reflect at least some radiation and always transmit some radiation (even if only radiation which is polarized in the appropriate direction is incident on it). In this example, applying a voltage to electro-optical material layer 1 alters the proportion that is reflected and the proportion that is transmitted, i.e., the transmission/reflection characteristic. Depending on the composition of the stack, maximum reflection of the element may be obtained by applying no voltage to the stack or by applying a nominal maximum voltage to the stack and, correspondingly, maximum transmission will be obtained by applying the maximum nominal voltage or no voltage, respectively. By applying intermediate voltages, an intermediate level of reflection/transmission of radiation polarized in the given direction will be provided. Therefore, the elements of the array of individually controllable elements PPM can be used to provide gray-scales.

In one example, for support the stack of layers of dielectric material 1 may be attached to a substrate 4, which can be common to all elements in an array of individually controllable elements PPM.

In one example, when the array of individually controllable elements PPM is to be transmissive, then substrate 4 is transmissive, such that reflection of the radiation at the boundary between the stack and substrate 4 is minimized.

In one example, when the array of individually controllable elements PPM is reflective, then radiation that is transmitted through the stack is not reflected. In one example, this is achieved by selecting substrate 4 that is transmissive, as before, and directing the radiation transmitted through substrate 4 out of the system, or by selecting substrate 4 that absorbs the radiation.

In one example, electro-optical material layer 1 may be selected such that when no voltage is applied it has substantially the same refractive index as fixed refractive index layers 2,3. Alternatively, electro-optical material layer 1 may be selected to have a different refractive index to fixed refractive index layers 2,3 when no voltage is applied. Therefore, the individually controllable element can be either biased to be transmissive or biased to be reflective, respectively.

As described above, the refractive index of electro-optical material layer 1 is only voltage-controlled for radiation that is plane polarized in a given direction. Therefore, electro-optical material layer 1 may be selected such that the refractive index for radiation that is plane polarized in an orthogonal direction is set to filter out the radiation that is plane polarized in that direction.

For example, if the individually controllable element is to be used to form a reflective array of individually controllable elements PPM, the refractive index of electro-optical material layer 1 for radiation that is plane polarized orthogonally to the direction that can be controlled, may be set to be substantially the same as the refractive index of fixed refractive index layers 2,3 such that this radiation, which cannot be controlled by applying a voltage to electro-optical material layer 1, is transmitted through the individually controllable element and therefore not reflected into a projection system (e.g., PL). Consequently, it may not be necessary to illuminate the array of individually controllable elements PPM with radiation that is plane polarized in a given direction. In this example, the radiation transmitted through the element (i.e., unpatterned radiation) will need to be prevented from being reflected back into the projection system PL, namely absorbed or be transmitted through the entire device.

In one example, electro-optical material layer 1 can be formed of, for example, Potassium Di-hydrogen Phosphate (KD*P or KDP), Andenosine Diphosphate (AD*P or ADP), Beta Barium Borate (BBO) other well-known solid state electro-optical materials or crystals.

In one example, the electro-optical materials should be operated close to, but above, the Curie temperature of the material used. These are generally lower than ambient temperatures. KDP, for example, has a Curie temperature of 123K. and ADP of 148K. Therefore a temperature controlled cooling unit may be provided.

In one example, to provide a. control voltage to electro-optical material layer 1, transparent electrodes 5, 6 are provided between electro-optical material layer 1 and fixed refractive index layers 2,3. In this example, electrodes 5, 6 are sufficiently thin, such that they should not affect the transmission/reflection characteristics of the boundaries between electro-optical material layer 1 and fixed refractive index layers 2,3. Alternatively, electrodes 5, 6 may be applied to the edges of electro-optical material layer 1, namely faces that are not in contact with fixed refractive index layers 2, 3. However, in this case the driving potentials would need to be higher.

Figure 3:
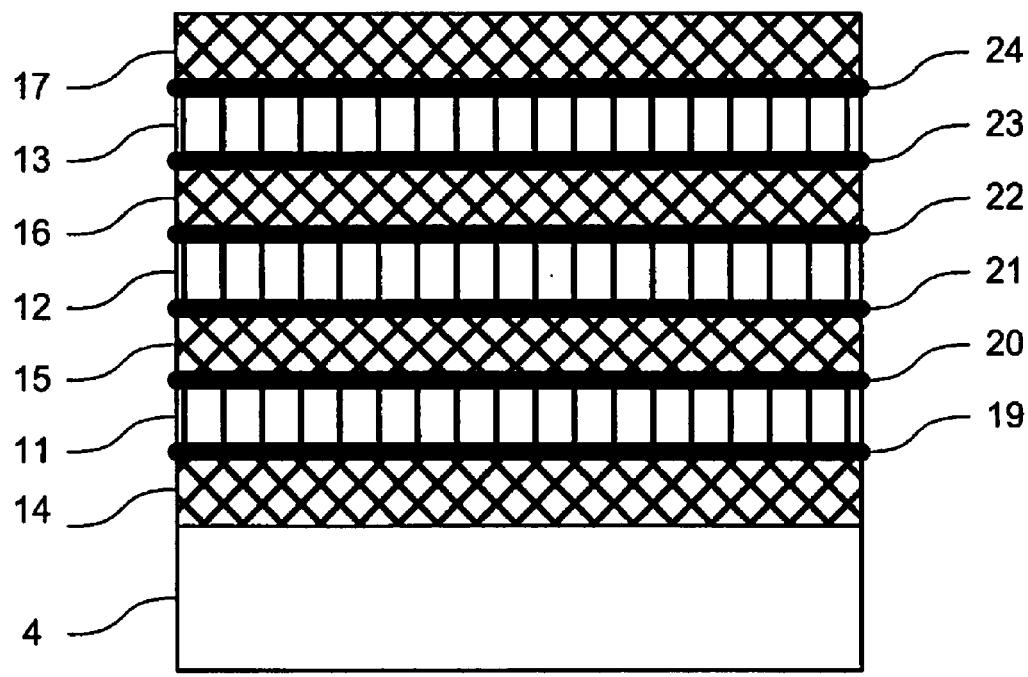

FIG. 3 depicts an element that can be used to form a programmable patterning device, according to one embodiment of the present invention. In one example, to improve the reflectivity of the stack, additional layers 11, 12, 13 of electro-optical material are added, alternating with layers 14, 15, 16, 17 of material with fixed refractive index. As discussed above, the stack can be attached to a substrate 4 for support and electrodes 19 to 24 can be provided to apply the control voltages to electro-optical material layers 11, 12, 13.

It is to be appreciated that, although FIG. 3 shows the stack with three layers 11, 12, and 13 of electro-optical material layer, any number of layers may be used in a corresponding fashion.

In one example, electro-optical material layers 11, 12, 13 are oriented such that their respective extraordinary axes are mutually parallel. Consequently, the control voltages applied to them control the transmission/reflection characteristics of their boundaries with the material with fixed refractive index for radiation that is polarized in the same direction.

In this example, the control voltage applied to the electro-optical material layer 1 is provided by electrodes 19, 20. The control voltage for electro-optical material layer 12 is provided by electrodes 21, 22. The control voltage for the electro-optical material layer 13 is provided by electrodes 23, 24.

In one example, when the individually controllable element is to be used as a simple gray-scale generating element for an array of individually controllable elements PPM, electrodes 19 to 24 for electro-optical material layers 11, 12, 13 may be connected together, such that a common control voltage is applied to each of electro-optical material layers 11, 12, 13. In other words, electrodes 19, 21, 23 are connected together and electrodes 20, 22, 24 are connected together. Alternatively, the respective pairs of electrodes for each of electro-optical material layers 11, 12, 13 may be independently addressed with different voltages. This may be used to provide a phase-shifting mask, as described below.

In one example, radiation passing through a layer of electro-optical material has its phase shifted. The magnitude of the phase shift is dependant on the voltage that is applied to the electro-optical material layer. Consequently, by providing an individually controllable element with a plurality of electro-optical material layers, it is possible to control not only the total reflection/transmission of the radiation incident on the element (to produce gray-scales), but also to control the total phase shift of the radiation. Therefore, it is possible to create a phase difference between radiation propagating from adjacent individually controllable elements, for example, even if the intensity of the radiation is the same. Consequently, these elements can be used to form an array of individually controllable elements PPM that not only generate gray-scales but also is a phase-shifting patterning array.

Figure 4:
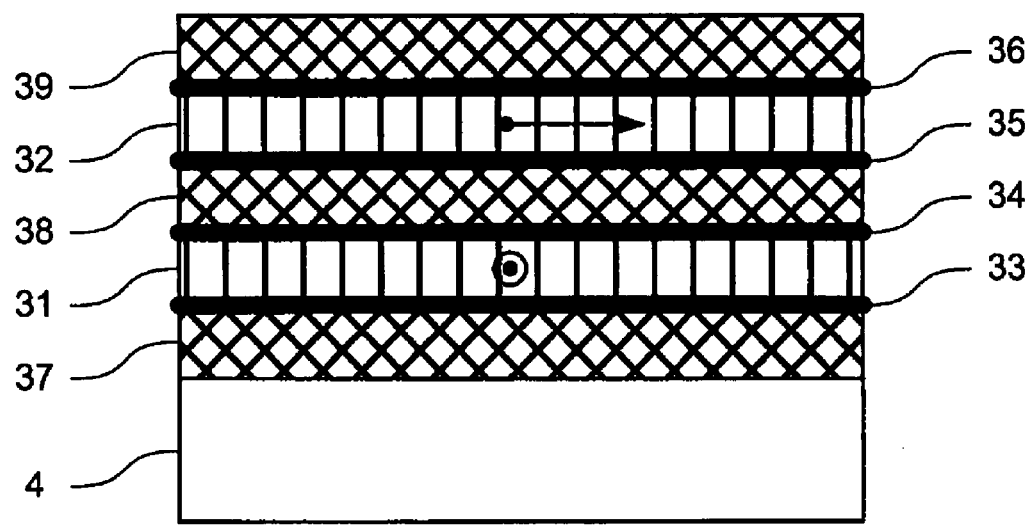

FIG. 4 depicts an element that can be used to form a programmable patterning device PPM, according to one embodiment of the present invention. In one example, each layer of electro-optical material controls the reflection/transmission characteristic of radiation that is plane polarized in a given direction. Further, by selecting the electro-optical material such that its refractive index, for radiation that is plane polarized in a first direction orthogonal to the direction for which its refractive index is voltage-controllable, is substantially the same as the layers adjacent to it, that portion of the stack will be transmissive to radiation that is plane polarized in the first direction. FIG. 4 shows an element for an array of individually controllable elements PPM utilizing these features. The element in FIG. 4 comprises two electro-optical material layers 31, 32, controllable by electrodes 33, 34 and electrodes 35, 36, respectively. Electro-optical material layers 31, 32 are sandwiched between alternating layers 37, 38, 39 of fixed refractive index material, and the complete stack is supported on a substrate 4.

In this embodiment, electro-optical material layers 31, 32 are arranged such that their respective extraordinary axes are perpendicular to one another. Consequently, applying a voltage to a first electro-optical material layer 31 controls its reflection/transmission characteristic for radiation that is plane polarized in a first direction, and applying a control voltage to a second electro-optical material layer 32 controls its reflection/transmission characteristic for radiation that is plane polarized in a second direction, which is perpendicular to the first direction. Consequently, this individually controllable element can be used to independently control radiation that is plane polarized in the first direction and radiation that is plane polarized in the second direction.

In an example in which the element is utilized in a lithographic projection apparatus, different patterns can be applied to radiation that is plane polarized in two orthogonal directions, allowing simultaneous dual dipole illumination. This allows for imaging a pattern with plane polarized light and permits enhanced imaging of features that are elongate in a particular direction.

Illumination with polarized radiation has previously been used to illuminate such elongate features but has, for example, required the use of two separate exposures, each with radiation plane polarized in orthogonal directions to separately image the features that are oriented in orthogonal directions. Using elements as shown in FIG. 4, it is possible to provide the same effect using a single exposure.

For example, the radiation system may have a secondary source plane and be adapted to generate a beam with four poles in the secondary source plane. The four poles can be arranged in two pairs such that a line between the centers of the first pair of poles is orthogonal to a line between the centers of the second pair of poles and the lines intersect at the optical axis of the radiation system. Furthermore, the system can be arranged such that the radiation of the first pair of poles is plane polarized in one direction and the radiation of the second pair of poles is plane polarized in a second direction, which is orthogonal to the first direction.

It is to be appreciated that additional electro-optical material layers can be added to the individually controllable element shown in FIG. 4. For example, there may be a plurality of electro-optical material layers with extraordinary axes arranged in a first direction and a plurality of electro-optical material layers with their extraordinary axes in a second, perpendicular, direction. With such an arrangement, it is possible to independently control the phase and gray-scale of radiation which is plane polarized in two orthogonal directions.

In an alternative use of the individually controllable element shown in FIG. 4 (and corresponding elements with multiple electro-optical material layers arranged perpendicularly to one another), the electrodes may be connected together to provide a common control voltage to the electro-optical material layers that are arranged with the extraordinary axes perpendicular to one another. Consequently, in this example, the control of the reflection/transmission characteristic for each will be substantially the same. Therefore, the reflection/transmission of radiation that is plane polarized in two orthogonal directions will be the same. Therefore, arrays of individually controllable elements comprising such elements will not need to be illuminated with plane polarized light.

In an example in which phase control is used, then a plurality of pairs of electro-optical material layers can be provided, each pair comprised of electro-optical material layers arranged with their extraordinary axes perpendicular to one another and each pair of layers controlled jointly but independently of the other pairs of electro-optical material layers.

Exemplary Environment

Figure 5:
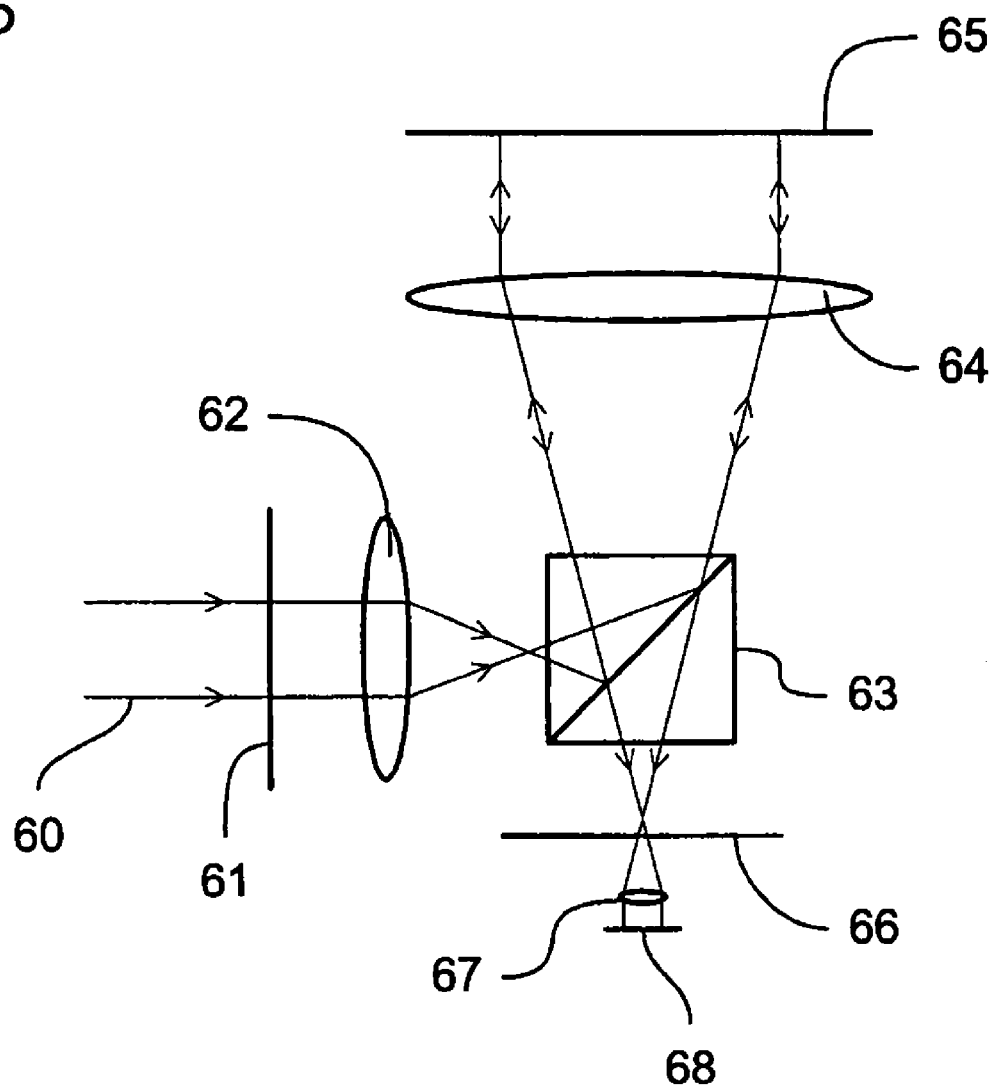
FIG. 5 depicts an arrangement for using a programmable patterning device, according to one embodiment of the present invention in a lithographic projection apparatus.

FIG. 5 depicts an arrangement for using a programmable patterning device in a lithographic projection apparatus, according to one embodiment of the present invention. Radiation from an illumination system 60 is polarized by a polarizer 61 (i.e., so that it is plane polarized in a given direction) and projected onto a beam splitter 63 by way of control optics 62. The beam is reflected by beam splitter 63 and projected onto an array of individually controllable elements 65 by way of further control optics 64. The beam of radiation is patterned and reflected by array of individually controllable elements 65, projected through control optics 64, and transmitted through beam splitter 63.

The patterned beam subsequently passes through a rotational polarizor 66, for example a ¼ lambda plate, before being projected onto a substrate 68 by a projection system 67.

In one example, the ¼ lambda may be omitted and, in particular, it should be omitted if dual dipole illumination is being used.

In one example, polarizer 61 can be omitted by using a polarizing beam splitter instead of standard beam splitter 63.

In one example, the elements of the array of individually controllable elements 65 include electro-optical material layers that are arranged to have mutually perpendicular extraordinary axes and that are controlled to operate together, then polarizer 61 can be omitted and standard beam splitter 63 retained. This is because, as described above, array of individually controllable elements 65 need not to be illuminated with polarized light.

Similarly, in an example where dual dipole illumination is being used the standard (i.e., non-polarizing) beam splitter 63 can be retained, but the polarizer 61 is be split up to provide radiation for each dipole direction with its own polarization direction.

CONCLUSION

While specific embodiments of the invention have been described above, it will be appreciated that the invention may be practiced otherwise than as described. The description is not intended to limit the invention.

What is claimed is:

1. A lithographic apparatus, comprising:
   an illumination system configured to produce a beam of radiation;
   an array of individually controllable elements configured to pattern the beam; and
   a projection system configured to project the patterned beam onto a target portion of a substrate,
   wherein each element in the array of individually controllable elements comprises a stack of top, middle, and bottom dielectric layers, at least the middle dielectric layer comprising a solid state electro-optical material that is plane polarized in an extraordinary axis, wherein the middle dielectric layer of each element is configured to receive a respective control signal that has a first state and a second state, wherein a portion of incident radiation having a first polarization state that is reflected by each element when the respective control signal is in the first and second states is different, and wherein a portion of incident radiation having a second polarization state that is reflected by each element is substantially the same when the respective control signal is in the first and second states.

2. The lithographic apparatus of claim 1, wherein:

during the first state there is a first difference value in refractive index for the first polarization state between the middle dielectric layer and the top and bottom dielectric layer; and during the second state there is a second difference value, which is smaller than the first difference value, in the refractive index for the first polarization state.

3. The lithographic apparatus of claim 1, wherein the stack further comprises:

additional layers of dielectric material, wherein at least one of the additional layers is formed from electro-optical material, whereby a refractive index of the at least one additional layer for the first polarization state is changed by applying a control signal to the at least one additional layer of electro-optical material.

4. The lithographic apparatus of claim 3, wherein:

alternate dielectric layers of the stack are formed from material with a fixed refractive index; and respective other layers are formed from an electro-optical material having a refractive index for a given respective polarization state that is changed by applying the control signal to each of the respective other layers.

5. The lithographic apparatus of claim 4, further comprising:

electrodes that are configured to apply a common control signal to the dielectric layers foil led from the electro-optical material that have substantially mutually parallel extraordinary axes.

6. The lithographic apparatus of claim 3, wherein the layers of electro-optical material are arranged such that their respective extraordinary axes are substantially mutually parallel.

7. The lithographic apparatus of claim 3, wherein at least two layers of electro-optical material are arranged such that their extraordinary axes are substantially mutually perpendicular.

8. The lithographic apparatus of claim 3, further comprising:

electrodes configured to apply an independently controllable control voltage to each layer of the electro-optical material within the stack.

9. The lithographic apparatus of claim 3, further comprising:

electrodes configured to apply a common control voltage to two or more layers of the electro-optical material within the stack.

10. The lithographic apparatus of claim 1, wherein each of the elements in the array of individually controllable elements is configured to control a propagation of the radiation that is plane polarized in a first direction and, independently, a propagation of the radiation that is plane polarized in a second direction and substantially orthogonal to the first direction.

11. The lithographic apparatus of claim 10, wherein the illumination system has a secondary source plane and is configured to generate a beam having four poles in the secondary source plane.

12. The lithographic apparatus of claim 11, wherein:

the four poles are arranged in first and second pairs;

a first line joining centers of the first pair is orthogonal to a second line joining centers of the second pair poles; and the first and second lines intersect substantially at an optical axis of the illumination system.

13. The lithographic apparatus of claim 12, wherein:

the radiation of the first pair is plane polarized in the first direction; and the radiation of the second pair is plane polarized in the second direction.

14. An array of individually controllable elements that pattern a beam of radiation, wherein each element in the array of individually controllable elements comprises:

top, middle, and bottom dielectric layers, at least the middle dielectric layer being formed of a solid state electro-optical material that is plane polarized in an extraordinary axis, wherein the middle dielectric layer of each element is configured to receive a respective control signal that has a first state and a second state, wherein a portion of incident radiation having a first polarization state that is reflected by each element when the respective control signal is in the first and second states is different, and wherein a portion of incident radiation having a second polarization state that is reflected by each element is substantially the same when the respective control signal is in the first and second states.

15. The element of claim 14, wherein:

during the first state there is a first difference value in refractive index for the first polarization state between the middle dielectric layer and the top and bottom dielectric layers; and during the second state there is a second difference value, which is smaller than the first difference value, in the refractive index for the first polarization state.

16. A lithographic device manufacturing method, comprising:

forming each element in an array of individually controllable elements from top, middle, and bottom dielectric layers;

forming at least the middle dielectric layer from a solid state electro-optical material that is plane polarized in an extraordinary axis, such that:

the middle dielectric layer of each element is configured to receive a control signal that has a first state and a second state, a portion of incident radiation having a first polarization state that is reflected by the element is different when the control signal is in the first and second states, and a portion of incident radiation having a second polarization state that is reflected by the element is substantially the same when the control signal is in the first and second states.

17. A device manufacturing method, comprising:

patterning a beam of radiation from an illumination source using the array of individually controllable elements, wherein each element in the array of individually controllable elements comprises a stack of top, middle, and bottom dielectric layers, at least the middle dielectric layer comprising a solid state electro-optical material that is plane polarized in an extraordinary axis, wherein the middle dielectric layer of each element is configured to receive a respective control signal that has a first state and a second state, wherein a portion of incident radiation having a first polarization state that is reflected by each element when the respective control signal is in the first and second states is different, and wherein a portion of incident radiation having a second polarization state that is reflected by each element is substantially the same when the respective control signal is in the first and second states; and projecting the patterned beam onto a target portion of a substrate.

18. The method of claim 17, wherein the patterning comprises applying the respective control signal to each of the elements to selectively switch the element between a first state and a second state based on whether the applied respective control signal is in first state or in the second state.

19. The method of claim 18, wherein:

during the first state there is a first difference value in refractive index for the first polarization state between the middle dielectric layer and the top and bottom dielectric layers; and during the second state there is a second difference value, which is smaller than the first difference value, in the refractive index for the first polarization state.

* * * * *

UNITED STATES PATENT AND TRADEMARK OFFICE
CERTIFICATE OF CORRECTION

| | |
|---|---|
| PATENT NO. | : 7,826,035 B2 |
| APPLICATION NO. | : 11/725499 |
| DATED | : November 2, 2010 |
| INVENTOR(S) | : Arno Jan Bleeker |

Page 1 of 1

It is certified that error appears in the above-identified patent and that said Letters Patent is hereby corrected as shown below:

Claim 5, column 13, line 42, please delete "foil led" and insert --formed--.

Signed and Sealed this
Eighteenth Day of January, 2011

David J. Kappos
*Director of the United States Patent and Trademark Office*